US008076243B2

(12) United States Patent
Dussarrat et al.

(10) Patent No.: US 8,076,243 B2
(45) Date of Patent: Dec. 13, 2011

(54) METAL PRECURSORS FOR DEPOSITION OF METAL-CONTAINING FILMS

(75) Inventors: Christian Dussarrat, Wilmington, DE (US); Clement Lansalot-Matras, Ibaraki-Pref. (JP); Vincent M. Omarjee, Bear, DE (US); Cheng-Fang Hsiao, Tsukuba (JP)

(73) Assignees: L'Air Liquide Societe Anonyme pour l'Etude et l'Exploitation des Procedes Georges Claude, Paris (FR); American Air Liquide, Inc., Fremont, CA (US)

( * ) Notice: Subject to any disclaimer, the term of this patent is extended or adjusted under 35 U.S.C. 154(b) by 0 days.

(21) Appl. No.: 12/693,930

(22) Filed: Jan. 26, 2010

(65) Prior Publication Data

US 2010/0193951 A1 Aug. 5, 2010

Related U.S. Application Data

(60) Provisional application No. 61/147,380, filed on Jan. 26, 2009.

(51) Int. Cl.
*H01L 23/48* (2006.01)
(52) U.S. Cl. ................... 438/681; 257/E21.295
(58) Field of Classification Search ............ 438/681
See application file for complete search history.

(56) References Cited

U.S. PATENT DOCUMENTS

| 6,939,578 | B2 | 9/2005 | Bradley et al. |
| 7,268,365 | B2 | 9/2007 | Bradley et al. |
| 2006/0292873 | A1* | 12/2006 | Millward et al. ............. 438/681 |
| 2008/0119098 | A1* | 5/2008 | Palley et al. ................... 442/64 |

FOREIGN PATENT DOCUMENTS

WO    WO 2007 019435    2/2007

OTHER PUBLICATIONS

Park, K-H et al. "Remarkably Volatile Copper(II) Complexes of N,N'-Unsymmetrically Substitutes 1,3-Diketimines as Precursors for Cu Metal Deposition via CVD or ALD", J. Am. Chem. Soc. 2005 127.
Park, K-H et al. "Nonfluorinated Volatile Copper(I) 1,3-Diketiminates as Precursors for Cu Metal Deposition via Atomic Layer Deposition", Inorganic Chem. 2006 45(21) pp. 8480-8482.

* cited by examiner

*Primary Examiner* — Alexander Ghyka
(74) *Attorney, Agent, or Firm* — Patricia E. McQueeney

(57) ABSTRACT

Compositions and methods for forming a metal-containing thin film on a substrate. A reactor and at least one substrate in the reactor are provided. A metal-containing bis-β-diketiminate precursor is introduced into the reactor. The reactor is maintained at a set temperature and pressure, and the precursor is contacted with the substrate to form a metal-containing film on the substrate.

5 Claims, 3 Drawing Sheets (a)

(b)

(a)

(b)

METAL PRECURSORS FOR DEPOSITION OF METAL-CONTAINING FILMS

CROSS-REFERENCE TO RELATED APPLICATIONS

The present application claims the benefit of U.S. Provisional Application Ser. No. 61/147,380, filed Jan. 26, 2009, herein incorporated by reference in its entirety for all purposes.

BACKGROUND

1. Field of the Invention

This invention relates generally to compositions, methods and apparatus used for use in the manufacture of semiconductor, photovoltaic, LCF-TFT, or flat panel type devices. More specifically, the invention relates to methods and compositions for utilizing a metal bis-β-diketiminate precursor.

2. Background of the Invention

Controlling the atomic layer growth is one of the ultimate goals for the semiconductor industry. Copper has displaced aluminum to become the standard back-end-of-line (BEOL) metallization material for advanced logic devices. Copper's benefits over aluminum for logic are now well-documented. Its lower resistivity allows line thickness to be reduced by nearly one-third while achieving similar sheet resistance (as aluminum). Ta/TaN liner/barrier and Cu seed layer are usually deposited using Ionized Physical Vapor Deposition (iPVD) and trenches may be filled with Cu by Electro-Chemical Deposition (ECD). One limitation inherent with this process is the non-conformality of the deposition of Cu by iPVD.

The formation of copper containing films via Chemical Vapor and Atomic Layer Deposition (CVD and ALD) are promising. CVD and ALD are the main gas phase chemical process used to control deposition at the atomic scale and create extremely thin and conformal coatings. In a typical CVD process, the wafer is exposed to one or more volatile precursors, which react and/or decompose on the substrate surface to produce the desired deposit. ALD process are based on sequential and saturating surface reactions of alternatively applied metal precursor, separated by inert gas purging. For process reasons, deposition of copper would be best realized at low temperature, below 150° C., which makes deposition of copper particularly challenging. To overcome this difficulty, some have used a surface activating agent (pyrazole for instance) to enable the deposition of copper using copper bis-β-diketiminate precursors on metal surface at low temperature. Nevertheless direct deposition of copper on the semiconductor substrate remains impossible in a classical thermal CVD or ALD process.

Furthermore, metal silicide layers are a useful material in transistors to improve the conductivity of polysilicon. For instance nickel silicide (NiSi) or cobalt silicide (CoSi$_2$) may be used as a contact in the source and drain of the transistor to improve conductivity. The process to form metal silicide begins by the deposition of a thin transition metal layer, nickel for instance, on the polysilicon. The metal and a portion of the polysilicon are then alloyed together to form the metal silicide layer. In theory, a thin layer of pure metal could be produced using CVD or ALD process but, the process could fail if the precursor has too much thermal stability.

PEALD and PECVD are promising techniques to produce high purity and high-density metal thin films even at low growth temperatures. During a plasma process, plasma is introduced during the reactant pulse step of each cycle to activate the reducing gas, which will further react with the surface species. PEALD and PECVD process have never been considered so far for the deposition of metal films using metal bis-β-diketiminate precursors.

Consequently, there exists a need for metal bis-β-diketiminate precursors, and methods of their use in deposition processes for creating a thin film.

BRIEF SUMMARY

Embodiments of the present invention provide novel methods and compositions useful for the deposition of a film on a substrate. In general, the disclosed compositions and methods utilize a bis-β-diketiminate metal precursor.

In an embodiment, a method for depositing a film on a substrate comprises providing a reactor with at least one substrate disposed in the reactor. A metal-containing precursor is introduced into the reactor, wherein the precursor has the general formula:

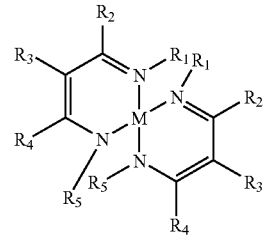

wherein M is a transition metal with +2 oxidation state, selected from among the elements Mn, Fe, Co, Ni, Cu, Ru, and Pd. Each of $R_1$, $R_2$, $R_3$, $R_4$, and $R_5$, are independently selected from H, a C1-C5 alkyl group, an alkyl amino group and Si(R')$_3$, where R' is independently selected from H, and a C1-C5 alkyl group. The reactor is maintained at a temperature of at least about 50° C., and at a pressure of at least about 1 Pa; and the precursor is contacted with the substrate to deposit or form a metal-containing film on the substrate.

Other embodiments of the current invention may include, without limitation, one or more of the following features:

- the reactor is maintained at a temperature between about 50° C. and 500° C., and preferably between about 50° C. and 250° C.;
- the reactor is maintained at a pressure between about 1 Pa and 10$^5$ Pa, and preferably between about 25 Pa and 10$^3$ PA;
- a reducing gas is introduced to the reactor, and the reducing gas is reacted with at least part of the precursor, prior to or concurrently with the deposition of at least part of the precursor onto the substrate;
- the reducing gas is one of H$_2$; NH$_3$; SiH$_4$; Si$_2$H$_6$; Si$_3$H$_8$; SiH$_2$Me$_2$, SiH$_2$Et$_2$, N(SiH$_3$)$_3$, hydrogen radicals; and mixtures thereof;
- an oxidizing gas is introduced to the reactor, and the oxidizing gas is reacted with at least part of the precursor, prior to or concurrently with the deposition of at least part of the precursor onto the substrate;
- the oxidizing gas is one of O$_2$; O$_3$; H$_2$O; NO; oxygen radicals; carboxylic acid; and mixtures thereof;
- the deposition process is a chemical vapor deposition ("CVD") type process or an atomic layer deposition ("ALD") type process, and either may be plasma enhanced; and precursor is selected from:
bis(4N-methylaminopent-3-en-2N-methyliminato) Copper(II);
bis(4N-ethylaminopent-3-en-2N-ethyliminato) Copper (II);
bis(4N-isopropylaminopent-3-en-2N-isopropyliminato) Copper(II);
bis(4N-n-propylaminopent-3-en-2N-n-propyliminato) Copper(II);
bis(4N-n-butylaminopent-3-en-2N-n-butyliminato) Copper(II);
bis(4N-methylamino-5-methylhex-3-en-2N-methyliminato) Copper(II);
bis(4N-ethylamino-5-methylhex-3-en-2N-ethyliminato) Copper(II);
bis(4N-isopropylamino-5-methylhex-3-en-2N-isopropyliminato) Copper(II);
bis(4N-n-propylamino-5-methylhex-3-en-2N-n-propyliminato) Copper(II);
bis(4N-methylamino-6-methylhept-3-en-2N-methyliminato) Copper(II);
bis(4N-ethylamino-6-methylhept-3-en-2N-ethyliminato) Copper(II);
bis(4N-isopropylamino-6-methylhept-3-en-2N-isopropyliminato) Copper(II);
bis(4N-n-propylamino-6-methylhept-3-en-2N-n-propyliminato) Copper(II);
bis(4N-methylaminopent-3-en-2N-ethyliminato) Copper(II);
bis(4N-methylamino-5-methylhex-3-en-2N-ethyliminato) Copper(II);
bis(4N-methylamino-6-methylhept-3-en-2N-ethyliminato) Copper(II);
bis(4N-methylaminopent-3-en-2N-methyliminato) Nickel(II);
bis(4N-ethylaminopent-3-en-2N-ethyliminato) Nickel (II);
bis(4N-isopropylaminopent-3-en-2N-isopropyliminato) Nickel(II);
bis(4N-n-propylaminopent-3-en-2N-n-propyliminato) Nickel(II);
bis(4N-n-butylaminopent-3-en-2N-n-butyliminato) Nickel(II);
bis(4N-methylamino-5-methylhex-3-en-2N-methyliminato) Nickel(II);
bis(4N-ethylamino-5-methylhex-3-en-2N-ethyliminato) Nickel(II);
bis(4N-isopropylamino-5-methylhex-3-en-2N-isopropyliminato) Nickel(II);
bis(4N-n-propylamino-5-methylhex-3-en-2N-n-propyliminato) Nickel(II);
bis(4N-methylamino-6-methylhept-3-en-2N-methyliminato) Nickel(II);
bis(4N-ethylamino-6-methylhept-3-en-2N-ethyliminato) Nickel(II);
bis(4N-isopropylamino-6-methylhept-3-en-2N-isopropyliminato) Nickel(II);
bis(4N-n-propylamino-6-methylhept-3-en-2N-n-propyliminato) Nickel(II);
bis(4N-methylaminopent-3-en-2N-ethyliminato) Nickel(II);
bis(4N-methylamino-5-methylhex-3-en-2N-ethyliminato) Nickel(II);
bis(4N-methylamino-6-methylhept-3-en-2N-ethyliminato) Nickel(II);
bis(4N-methylaminopent-3-en-2N-methyliminato) Palladium(II);
bis(4N-ethylaminopent-3-en-2N-ethyliminato) Palladium(II);
bis(4N-isopropylaminopent-3-en-2N-isopropyliminato) Palladium(II);
bis(4N-n-propylaminopent-3-en-2N-n-propyliminato) Palladium(II);
bis(4N-n-butylaminopent-3-en-2N-n-butyliminato) Palladium(II);
bis(4N-methylamino-5-methylhex-3-en-2N-methyliminato) Palladium(II);
bis(4N-ethylamino-5-methylhex-3-en-2N-ethyliminato) Palladium(II);
bis(4N-isopropylamino-5-methylhex-3-en-2N-isopropyliminato) Palladium(II);
bis(4N-n-propylamino-5-methylhex-3-en-2N-n-propyliminato) Palladium(II);
bis(4N-methylamino-6-methylhept-3-en-2N-methyliminato) Palladium(II);
bis(4N-ethylamino-6-methylhept-3-en-2N-ethyliminato) Palladium(II);
bis(4N-isopropylamino-6-methylhept-3-en-2N-isopropyliminato) Palladium(II);
bis(4N-n-propylamino-6-methylhept-3-en-2N-n-propyliminato) Palladium(II);
bis(4N-methylaminopent-3-en-2N-ethyliminato) Palladium(II);
bis(4N-methylamino-5-methylhex-3-en-2N-ethyliminato) Palladium(II);
bis(4N-methylamino-6-methylhept-3-en-2N-ethyliminato) Palladium(II);
bis(4N-methylaminopent-3-en-2N-methyliminato) Cobalt(II);
bis(4N-ethylaminopent-3-en-2N-ethyliminato) Cobalt (II);
bis(4N-isopropylaminopent-3-en-2N-isopropyliminato) Cobalt(II);
bis(4N-n-propylaminopent-3-en-2N-n-propyliminato) Cobalt(II);
bis(4N-n-butylaminopent-3-en-2N-n-butyliminato) Cobalt(II);
bis(4N-methylamino-5-methylhex-3-en-2N-methyliminato) Cobalt(II);
bis(4N-ethylamino-5-methylhex-3-en-2N-ethyliminato) Cobalt(II);
bis(4N-isopropylamino-5-methylhex-3-en-2N-isopropyliminato) Cobalt(II);
bis(4N-n-propylamino-5-methylhex-3-en-2N-n-propyliminato) Cobalt(II);
bis(4N-methylamino-6-methylhept-3-en-2N-methyliminato) Cobalt(II);
bis(4N-ethylamino-6-methylhept-3-en-2N-ethyliminato) Cobalt(II);
bis(4N-isopropylamino-6-methylhept-3-en-2N-isopropyliminato) Cobalt(II);
bis(4N-n-propylamino-6-methylhept-3-en-2N-n-propyliminato) Cobalt(II);
bis(4N-methylaminopent-3-en-2N-ethyliminato) Cobalt(II);
bis(4N-methylamino-5-methylhex-3-en-2N-ethyliminato) Cobalt(II); and
bis(4N-methylamino-6-methylhept-3-en-2N-ethyliminato) Cobalt(II).

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

NOTATION AND NOMENCLATURE

Certain terms are used throughout the following description and claims to refer to various components and constituents. This document does not intend to distinguish between components that differ in name but not function.

As used herein, the term "alkyl group" refers to saturated functional groups containing exclusively carbon and hydrogen atoms, Further, the term "alkyl group" may refer to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation, "Me," refers to a methyl group; the abbreviation, "Et," refers to an ethyl group; the abbreviation, "t-Bu," refers to a tertiary butyl group; the abbreviation "iPr", refers to an isopropyl group; the abbreviation "acac", refers to acetylacetonato; and the abbreviation "Cp" refers to a cyclopentadienyl group.

The standard abbreviations of the elements from the periodic table of elements are used herein. It should be understood that elements may be referred to by these abbreviations (e.g. Cu refers to copper, Ni refers to nickel, Pd refers to palladium, Pt refers to platinum, etc).

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
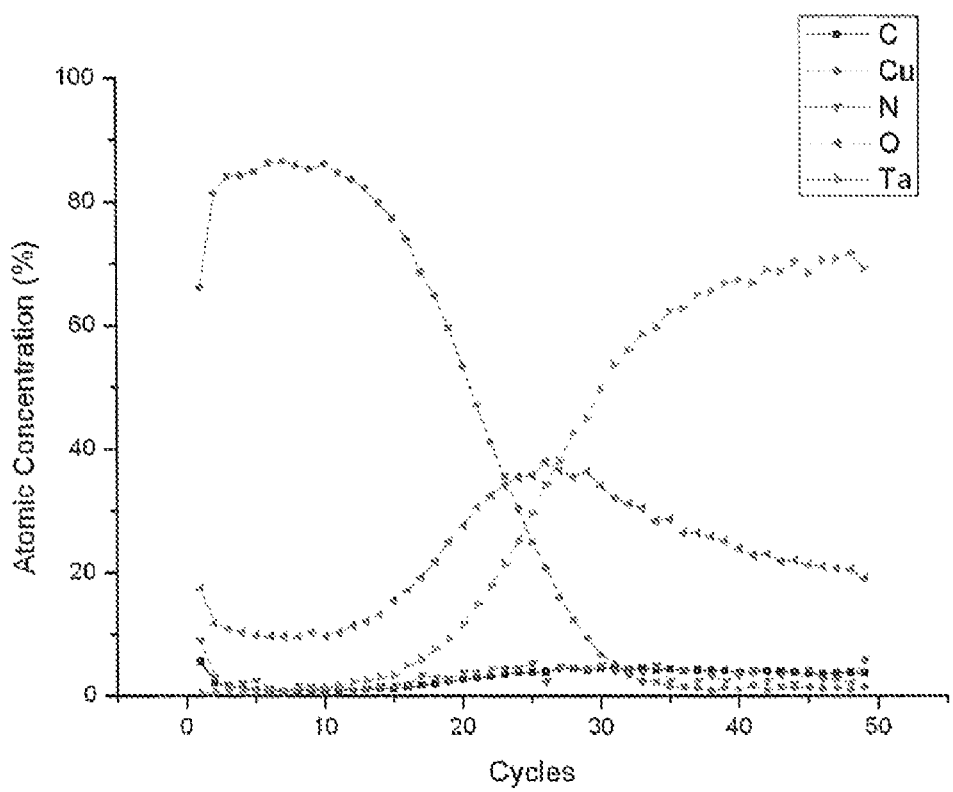
FIG. 1 illustrates depth profile data for a copper film deposited according to one embodiment of the current invention.

Embodiments of the present invention provide novel methods and compositions useful for the deposition of a film on a substrate. Methods to synthesize these compositions are also provided. In general, the disclosed compositions and methods utilize a bis-β-diketiminate metal precursor.

In some embodiments, the transition metal precursor has the general formula:

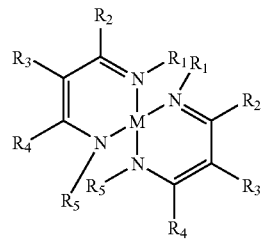

wherein M is a transition metal with +2 oxidation state, selected from among the elements Mn, Fe, Co, Ni, Cu, Ru, and Pd. Each of $R_1$, $R_2$, $R_3$, $R_4$, and $R_5$, are independently selected from H, a C1-C5 alkyl group, an alkyl amino group and $Si(R)_3$, where R' is independently selected from H, and a C1-C5 alkyl group.

In some embodiments the bis-β-diketiminate metal precursor may be used to deposit a pure metal film (M), or a metal silicate $(M_kSi_l)$, metal oxide $(M_nO_m)$ or metal oxynitride $(M_xN_yO_z)$ film (where k, l, m, n, x, y, and z are all integers which inclusively range from 1 to 6). These types of films may be useful in ReRAM type applications. Some typical film types include a palladium film, a cobalt film, a nickel film, a copper film, a PdO film, a NiO film, and a $Ni_2O_3$ film.

The disclosed precursors may be deposited to form a thin film using any deposition methods known to those of skill in the art. Examples of suitable deposition methods include without limitation, conventional CVD, low pressure chemical vapor deposition (LPCVD), plasma enhanced chemical vapor depositions (PECVD), atomic layer deposition (ALD), pulsed chemical vapor deposition (P-CVD), plasma enhanced atomic layer deposition (PE-ALD), or combinations thereof.

In an embodiment, the first precursor is introduced into a reactor in vapor form. The precursor in vapor form may be produced by vaporizing a liquid precursor solution, through a conventional vaporization step such as direct vaporization, distillation, or by bubbling an inert gas (e.g. $N_2$, He, Ar, etc.) into the precursor solution and providing the inert gas plus precursor mixture as a precursor vapor solution to the reactor. Bubbling with an inert gas may also remove any dissolved oxygen present in the precursor solution.

The reactor may be any enclosure or chamber within a device in which deposition methods take place such as without limitation, a cold-wall type reactor, a hot-wall type reactor, a single-wafer reactor, a multi-wafer reactor, or other types of deposition systems under conditions suitable to cause the precursors to react and form the layers.

Generally, the reactor contains one or more substrates on to which the thin films will be deposited. The one or more substrates may be any suitable substrate used in semiconductor, photovoltaic, flat panel, or LCD-TFT device manufacturing. Examples of suitable substrates include without limitation, silicon substrates, silica substrates, silicon nitride substrates, silicon oxy nitride substrates, tungsten substrates, tantalum substrate, or combinations thereof. Additionally, substrates comprising tungsten or noble metals (e.g. platinum, palladium, rhodium, or gold) may be used. The substrate may also have one or more layers of differing materials already deposited upon it from a previous manufacturing step.

In some embodiments, in addition to the first precursor, a reactant gas may also be introduced into the reactor. In some of these embodiments, the reactant gas may be an oxidizing gas such as one of oxygen, ozone, water, hydrogen peroxide, nitric oxide, nitrogen dioxide, radical species of these, as well as mixtures of any two or more of these. In some other of these embodiments, the reactant gas may be a reducing gas such as one of hydrogen, ammonia, a silane (e.g. $SiH_4$; $Si_2H_6$; $Si_3H_8$), $SiH_2Me_2$; $SiH_2Et_2$; $N(SiH_3)_3$; radical species of these, as well as mixtures of any two or more of these.

In some embodiments, and depending on what type of film is desired to be deposited, a second precursor may be introduced into the reactor. The second precursor comprises another metal source, such as copper, praseodymium, manganese, ruthenium, titanium, tantalum, bismuth, zirconium, hafnium, lead, niobium, magnesium, aluminum, lanthanum, or mixtures of these. In embodiments where a second metal-containing precursor is utilized, the resultant film deposited on the substrate may contain at least two different metal types.

The first precursor and any optional reactants or precursors may be introduced sequentially (as in ALD) or simultaneously (as in CVD) into the reaction chamber. In some embodiments, the reaction chamber is purged with an inert gas between the introduction of the precursor and the introduction of the reactant. In one embodiment, the reactant and the precursor may be mixed together to form a reactant/precursor mixture, and then introduced to the reactor in mixture form. In some embodiments, the reactant may be treated by a plasma, in order to decompose the reactant into its radical form. In some of these embodiments, the plasma may generally be at a location removed from the reaction chamber, for instance, in a remotely located plasma system. In other embodiments, the plasma may be generated or present within the reactor itself. One of skill in the art would generally recognize methods and apparatus suitable for such plasma treatment.

In some embodiments the precursor may be provided either in a neat form, or in a blend with a suitable solvent, such as: ethyl benzene, xylenes, mesitylene, decane, dodecane, where the solvents may be present in varying concentrations.

Depending on the particular process parameters, deposition may take place for a varying length of time. Generally, deposition may be allowed to continue as long as desired or necessary to produce a film with the necessary properties. Typical film thicknesses may vary from several hundred angstroms to several hundreds of microns, depending on the specific deposition process. The deposition process may also be performed as many times as necessary to obtain the desired film.

In some embodiments, the temperature and the pressure within the reactor are held at conditions suitable for ALD or CVD depositions. For instance, the pressure in the reactor may be held between about 1 Pa and about $10^5$ Pa, or preferably between about 25 Pa and $10^3$ Pa, as required per the deposition parameters. Likewise, the temperature in the reactor may be held between about 50° C. and about 500° C., preferably between about 50° C. and about 250° C.

In some embodiments, the precursor vapor solution and the reaction gas, may be pulsed sequentially or simultaneously (e.g. pulsed CVD) into the reactor. Each pulse of precursor may last for a time period ranging from about 0.01 seconds to about 10 seconds, alternatively from about 0.3 seconds to about 3 seconds, alternatively from about 0.5 seconds to about 2 seconds. In another embodiment, the reaction gas, may also be pulsed into the reactor. In such embodiments, the pulse of each gas may last for a time period ranging from about 0.01 seconds to about 10 seconds, alternatively from about 0.3 seconds to about 3 seconds, alternatively from about 0.5 seconds to about 2 seconds.

EXAMPLES

The following non-limiting examples are provided to further illustrate embodiments of the invention. However, the examples are not intended to be all inclusive and are not intended to limit the scope of the inventions described herein.

Example 1

PEALD tests were performed using bis(4N-ethylamino-pent-3-en-2N-ethyliminato) Copper(II) which was placed in a vessel heated up to 100° C. Typical PEALD conditions were used, such as using a hydrogen plasma with a reactor pressure fixed at ~2 Torr and plasma power optimized to 60 W to provide a complete reaction and limit impurities incorporation in the resulting film. ALD behavior with complete surface saturation and reaction was assessed at 100° C. Deposition rate as high as 0.21 Å/cycle was obtained at temperatures as low as 100° C. Auger Electron Spectroscopy (AES) of the films showed no Carbon or Nitrogen incorporation into the film (see FIG. 1 which is described more fully below). Continuous pure-copper films were successfully deposited on different substrates (Si, Ta, Ru) or structures such as vias or trenches with aspect ratio as high as 8 (see FIG. 2 which is described more fully below). Resistivity as low as 35 $\mu\Omega.cm^{-1}$ were obtained for 27 nm thick copper film.

FIG. 1 shows Auger Electron Spectroscopy (AES), depth profile of copper film deposited on Ta/TaN at 100° C. using 60 W plasma power.

Figure 2:
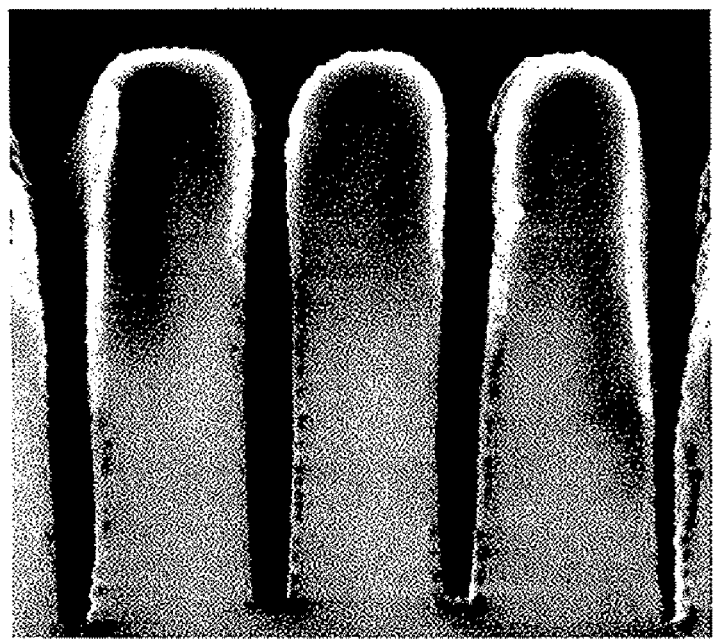
FIG. 2 illustrates a micrograph of a film deposited according to one embodiment of the current invention.
Figure 2:
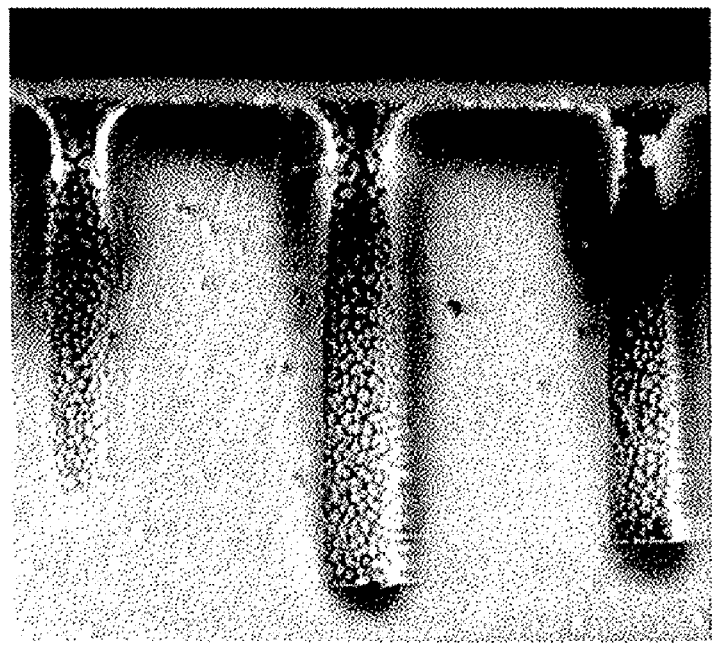

FIG. 2 shows a side wall of 120 nm wide, aspect ratio 8 trenches were covered by conformal Cu thin film (a). 150 nm diameter Vias side walls were also uniformly covered by Cu grains (b).

The table below shows further results with this experimental setup.

| Experiment N° | Precursor pulse time (s) | Plasma pulse time (s) | Plasma power (W) | Cycles | Thickness (Å) | Deposition rate (Å/cycle) |
|---|---|---|---|---|---|---|
| 1 | 5 | 10 | 60 | 800 | 135 | 0.17 |
| 2 | 7 | 10 | 60 | 800 | 165 | 0.205 |
| 3 | 10 | 10 | 60 | 800 | 170 | 0.21 |
| 4 | 15 | 10 | 60 | 800 | 170 | 0.21 |
| 5 | 5 | 3 | 60 | 800 | 70 | 0.088 |
| 6 | 5 | 6 | 60 | 800 | 105 | 0.13 |
| 7 | 5 | 15 | 60 | 800 | 150 | 0.19 |
| 8 | 5 | 21 | 60 | 800 | 150 | 0.19 |
| 9 | 7 | 10 | 60 | 1200 | 275 | 0.23 |
| 10 | 7 | 10 | 60 | 1600 | 290 | 0.18 |
| 11 | 7 | 10 | 60 | 2000 | 420 | 0.21 |

Example 2

PEALD tests were performed using bis(4N-ethylamino-pent-3-en-2N-ethyliminato) Nickel(II) which was placed in a vessel heated up to 100° C. Typical PEALD conditions were used, such as, using hydrogen plasma with a reactor pressure fixed at ~0.5 Torr and plasma power optimized to 200 W to provide a complete reaction and limit impurities incorporation. ALD behavior with complete surface saturation and reaction was assessed at 200° C. on a SiO$_2$ substrate. Deposition rate as high as 0.12 Å/cycle was obtained at 200° C. Auger Electron Spectroscopy (AES) of the films showed some Carbon incorporation into the film (~20%) (see FIG. 3, as described more fully below).

Figure 3:
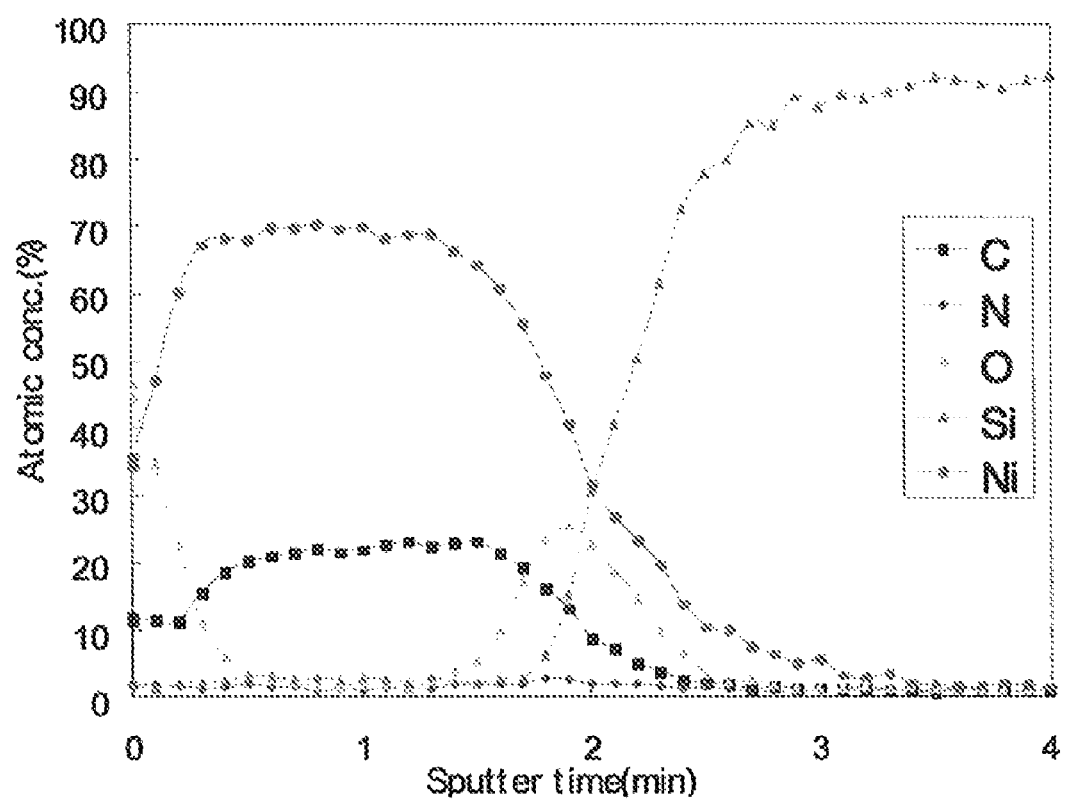
FIG. 3 illustrates depth profile data for a nickel film deposited according to one embodiment of the current invention.

FIG. 3 shows Auger Electron Spectroscopy (AES), depth profile of nickel film deposited on SiO$_2$ substrate at 200° C. using 200 W plasma power.

The table below shows further results with this experimental setup.

| Experiment N° | Precursor pulse time (s) | Plasma pulse time (s) | Plasma power (W) | Cycles | Thickness (Å) | Deposition rate (Å/cycle) |
|---|---|---|---|---|---|---|
| 1 | 2.5 | 5 | 200 | 2875 | 170 | 0.058 |
| 2 | 5 | 5 | 200 | 1700 | 220 | 0.13 |
| 3 | 10 | 5 | 200 | 2000 | 215 | 0.11 |
| 4 | 5 | 5 | 100 | 1570 | 75 | 0.047 |
| 5 | 5 | 5 | 300 | 1480 | 160 | 0.11 |
| 6 | 5 | 2.5 | 200 | 2220 | 175 | 0.078 |
| 7 | 5 | 10 | 200 | 1725 | 170 | 0.098 |

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method of forming a metal-containing film on a substrate, comprising:
   a) providing a reactor and at least one substrate disposed therein;
   b) introducing a metal-containing precursor into the reactor, wherein the metal-containing precursor is bis(4N-ethylaminopent-3-en-2N-ethyliminato) Nickel (II);
   c) maintaining the reactor at a temperature of at least about 50° C.;
   d) maintaining the reactor at a pressure of at least about 1 Pa;
   e) contacting the precursor with the substrate to form a metal-containing film; and
   f) introducing at least one oxidizing gas into the reactor, wherein the oxidizing gas comprises at least one member selected from the group consisting of: O$_2$; O$_3$; H$_2$O; NO; carboxylic acid; oxygen radicals; and mixtures thereof,
   wherein the metal-containing precursor and the oxidizing gas are introduced into the chamber sequentially, and the chamber is configured for plasma enhanced atomic layer deposition.

2. The method of claim 1, further comprising maintaining the reactor at a temperature between about 50° C. to about 500° C.

3. The method of claim 2, further comprising maintaining the reactor at a temperature between about 50° C. and about 250° C.

4. The method of claim 1, further comprising maintaining the reactor at a pressure between about 1 Pa and about 10$^5$ Pa.

5. The method of claim 4, further comprising maintaining the reactor at a pressure between about 25 Pa and about 10$^3$ Pa.

* * * * *